United States Patent

Chang

(10) Patent No.: US 9,564,205 B2
(45) Date of Patent: Feb. 7, 2017

(54) MEMORY APPARATUS AND METHOD FOR ACCESSING MEMORY

(71) Applicant: Winbond Electronics Corp., Taichung (TW)

(72) Inventor: Chih-Hsiang Chang, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 118 days.

(21) Appl. No.: 14/541,074

(22) Filed: Nov. 13, 2014

(65) Prior Publication Data

US 2016/0139833 A1 May 19, 2016

(51) Int. Cl.
| G06F 12/00 | (2006.01) |
| G06F 13/00 | (2006.01) |
| G06F 13/28 | (2006.01) |
| G11C 11/408 | (2006.01) |
| G11C 11/4076 | (2006.01) |
| G11C 11/406 | (2006.01) |
| G11C 16/32 | (2006.01) |

(52) U.S. Cl.
CPC .......... *G11C 11/408* (2013.01); *G11C 11/4076* (2013.01); *G11C 11/406* (2013.01); *G11C 16/32* (2013.01)

(58) Field of Classification Search
CPC .............. G06F 12/0246; G06F 11/106; G06F 17/30312; G06F 3/0679; G06F 3/0688
USPC ......................................................... 711/105
See application file for complete search history.

(56) References Cited

U.S. PATENT DOCUMENTS

| 4,583,205 A * | 4/1986 | Watanabe | G11C 16/12 326/108 |
| 6,118,722 A * | 9/2000 | Jeon | G11C 8/14 365/230.03 |
| 6,144,610 A * | 11/2000 | Zheng | G11C 11/4085 365/203 |
| 6,212,118 B1 * | 4/2001 | Fujita | G11C 11/406 365/200 |
| 2003/0058723 A1 * | 3/2003 | Vali | G11C 7/062 365/205 |
| 2003/0169622 A1 * | 9/2003 | Ooishi | G11C 16/3436 365/185.21 |
| 2006/0039229 A1 * | 2/2006 | Nakano | G11C 8/08 365/230.06 |

(Continued)

OTHER PUBLICATIONS

Kim et al., "Flipping Bits in Memory Without Accessing Them: An Experimental Study of DRAM Disturbance Errors," 2014 ACM/IEEE 41st International Symposium on Computer Architecture (ISCA), Jun. 2014, pp. 361-372.

(Continued)

*Primary Examiner* — Sheng-Jen Tsai
(74) *Attorney, Agent, or Firm* — Jianq Chyun IP Office

(57) ABSTRACT

A memory apparatus and a memory accessing method are provided. The memory accessing method includes: calculating an accessed times of each of a plurality of word line addresses; setting each of the corresponding word line addresses as an aggressor word line address by comparing the accessed times of the each of the word line addresses and a threshold accessed times; and setting a backup word line address, and replacing memory cells of the aggressor word line address by memory cells of the backup word line address.

12 Claims, 7 Drawing Sheets

(56) References Cited

U.S. PATENT DOCUMENTS

| | | | |
|---|---|---|---|
| 2008/0205139 A1* | 8/2008 | Futatsuyama | G11C 11/5628 365/185.03 |
| 2009/0244988 A1* | 10/2009 | Ashizawa | G11C 8/10 365/189.05 |
| 2010/0110810 A1* | 5/2010 | Kobayashi | G11C 11/406 365/200 |
| 2010/0202221 A1* | 8/2010 | Gupta | G11C 7/12 365/189.15 |
| 2011/0216587 A1* | 9/2011 | Lee | G11C 16/04 365/185.03 |
| 2012/0137067 A1* | 5/2012 | Lee | G11C 11/5642 711/114 |
| 2012/0230104 A1* | 9/2012 | Kim | G11C 11/5642 365/185.03 |
| 2013/0322194 A1* | 12/2013 | Rachamadugu | G11C 7/12 365/203 |
| 2014/0085995 A1 | 3/2014 | Greenfield et al. | |
| 2014/0089578 A1 | 3/2014 | Asamoto | |
| 2014/0146609 A1* | 5/2014 | Avila | G06F 11/106 365/185.17 |
| 2014/0317344 A1* | 10/2014 | Kim | G11C 7/02 711/105 |
| 2015/0049540 A1* | 2/2015 | Son | G11C 7/12 365/154 |
| 2015/0063002 A1* | 3/2015 | Toda | G11C 13/003 365/148 |
| 2015/0206572 A1* | 7/2015 | Lim | G11C 11/406 365/203 |
| 2016/0019940 A1* | 1/2016 | Jang | G11C 29/76 365/189.07 |

OTHER PUBLICATIONS

"Office Action of Taiwan Counterpart Application", issued on Mar. 17, 2016, p. 1-p. 5.

* cited by examiner

WLB  WLA  WLC

MEMORY APPARATUS AND METHOD FOR ACCESSING MEMORY

BACKGROUND

Technical Field

The invention relates to a method for accessing a memory, and particularly, the invention relates to a method for reducing a row hammer effect of a memory.

Related Art

In a specific application of a dynamic memory, a specific word line therein is probably required to be repeatedly turned on by many times. In this case, data stored in memory cells on word lines adjacent to the word line that is repeatedly turned on by many times is probably varied due to a cross talk effect or a coupling effect, and the situation mentioned above is called row hammer effect.

In detail, referring to FIG. 1, FIG. 1 is a schematic diagram of a dynamic memory having a row hammer effect. When the word line WLA is repeatedly turned on by many times during two adjacent refresh operations, the memory cells on the word lines WLB and WLC adjacent to the word line WLA may have a data error phenomenon due to the repeat turn-on operations of the word line WLA. The word lines WLB and WLC can be referred to as victim word lines, and the word line WLA can be referred to as an aggressor word line.

In the conventional technical field, additional refresh operations are generally performed to resolve the aforementioned problem of the row hammer effect. However, such solution cannot be implemented in burst type refresh operations. Moreover, to cope with the additional refresh operations to be performed, the specification of the dynamic memory is required to be modified, which may cause usage difficulty.

SUMMARY

The invention is directed to a memory apparatus and a method for accessing a memory, by which an influence probably caused by a row hammer effect occurred in a dynamic random access memory is effectively reduced.

The invention provides a method for accessing a memory, which includes following steps. An accessed times of each of a plurality of word line addresses is calculated. Each of the corresponding word line addresses is set as an aggressor word line address by comparing the accessed times and a threshold accessed times. A backup word line address is set, and memory cells of the aggressor word line address are replaced by memory cells of the backup word line address.

The invention provides a memory apparatus including a dynamic random access memory and a memory controller. The dynamic random access memory includes a plurality of word lines and a plurality of backup word lines. The memory controller is coupled to the word lines and the backup word lines, and the memory controller calculates an accessed times of a word line address of each of the word lines, and sets the word line address of each of the corresponding word lines as an aggressor word line address by comparing the accessed times and a threshold accessed times. The memory controller sets a backup word line address and replaces memory cells of the aggressor word line address by using memory cells of the backup word line address.

According to the above description, by calculating the accessed times of the word line address of the commonly used word line, whether the word line address of the word line is the aggressor word line address is determined. Moreover, when it is determined that the word line address of the word line is the aggressor word line address, the memory cells of the backup word line address are used to replace the memory cells of the aggressor word line address. In this way, a data error phenomenon probably occurred due to the row hammer effect is effectively avoided, so as to improve reliability of data stored in the memory.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
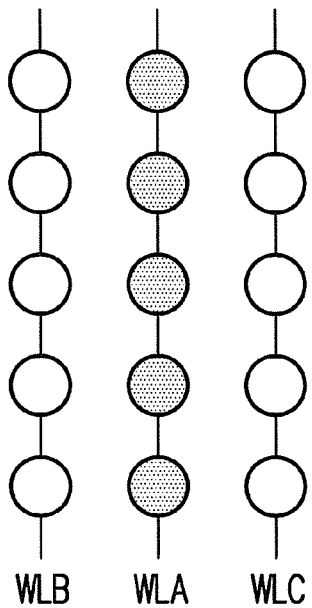
FIG. 1 is a schematic diagram of a dynamic memory having a row hammer effect.
Figure 2:
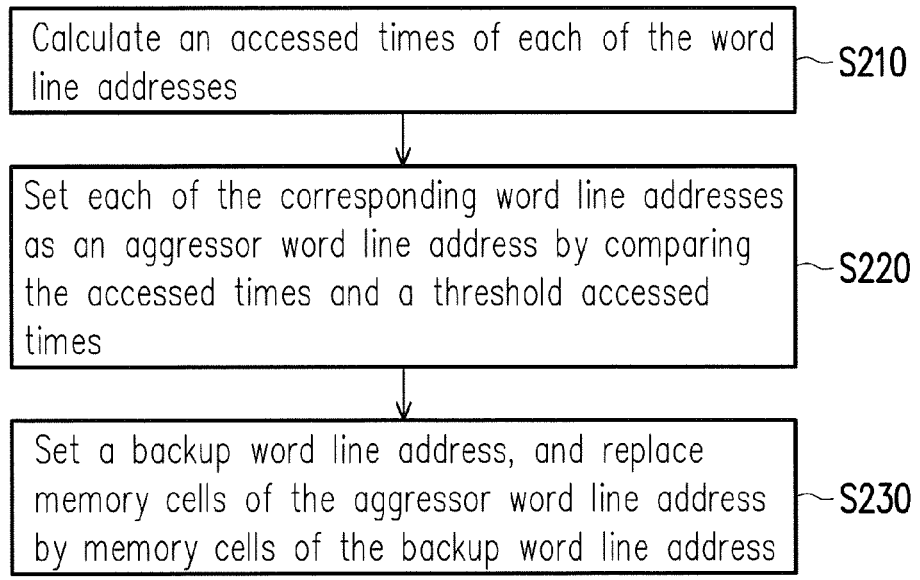
FIG. 2 is a flowchart illustrating a method for accessing a memory according to an embodiment of the invention.

Referring to FIG. 2, FIG. 2 is a flowchart illustrating a method for accessing a memory according to an embodiment of the invention. The present embodiment relates a method for accessing data of a dynamic random access memory, and particularly relates to a method for accessing the dynamic random access memory of a double-data-rate 4 (DDR4) specification. In step S210, during an operation process of the memory, an accessed times of each of a plurality of word line addresses is calculated. Calculation of the accessed times can be executed after a refresh operation of each of the word line addresses is executed, and when each of the word line addresses is turned on to perform an accessing operation, the value corresponding to the accessed times of each of the word line addresses can be increased progressively (for example, added by 1). Moreover, when a next refresh operation corresponding to each of the word line addresses is executed, the value corresponding to the accessed times of each of the word line addresses can be reset to 0.

In step S220, the accessed times of each of the word line addresses is compared with a threshold accessed times, and it is determined whether to set each of the word line addresses as an aggressor word line address according to the comparison result. In detail, when the accessed times of each of the word line addresses is greater than the threshold accessed times, it represents that the accessed times of such word line address is too high, which probably causes the row hammer effect to error of data in the memory cells of the adjacent word line addresses. Therefore, the word line address with the accessed times greater than the threshold accessed times is set as the aggressor word line address.

It should be noticed that the threshold accessed times is a predetermined value, and a designer of the memory can set the value of the threshold accessed times according to an actual working status of the memory.

In step S230, a backup word line address is set, and the backup word line address is used to replace the aggressor word line address, such that memory cells of the aggressor word line address are replaced by memory cells of the backup word line address to implement the data accessing operation. Here, in the memory, a part of the word line addresses may be preset as generally word line addresses, and another part of the word line addresses are set as the backup word line addresses. Moreover, the word lines adjacent to the backup word line addresses can be set as idle word lines.

When the backup word line address is used to replace the aggressor word line address, data stored in the memory cells on the aggressor word line address is first transferred to the memory cells of the backup word line address, and then the aggressor word line address is replaced by the backup word line address.

On the other hand, after the refresh operation of the aggressor word line address is performed, it represents that the aggressor word line address can be normally used. Therefore, besides that the value of the accessed times of the aggressor word line address is reset, the memory cells of the aggressor word line address can be used to replace the memory cells of the backup word line address, such that the memory cells of the aggressor word line address can be continually used.

In other words, after the refresh operation of the aggressor word line address is performed, data in the memory cells of the backup word line address is first duplicated to the aggressor word line address, and a logic address mapped to the backup word line address is changed to be mapped to the aggressor word line address, so as to restore the aggressor word line address to the normal word line address.

Figure 3:
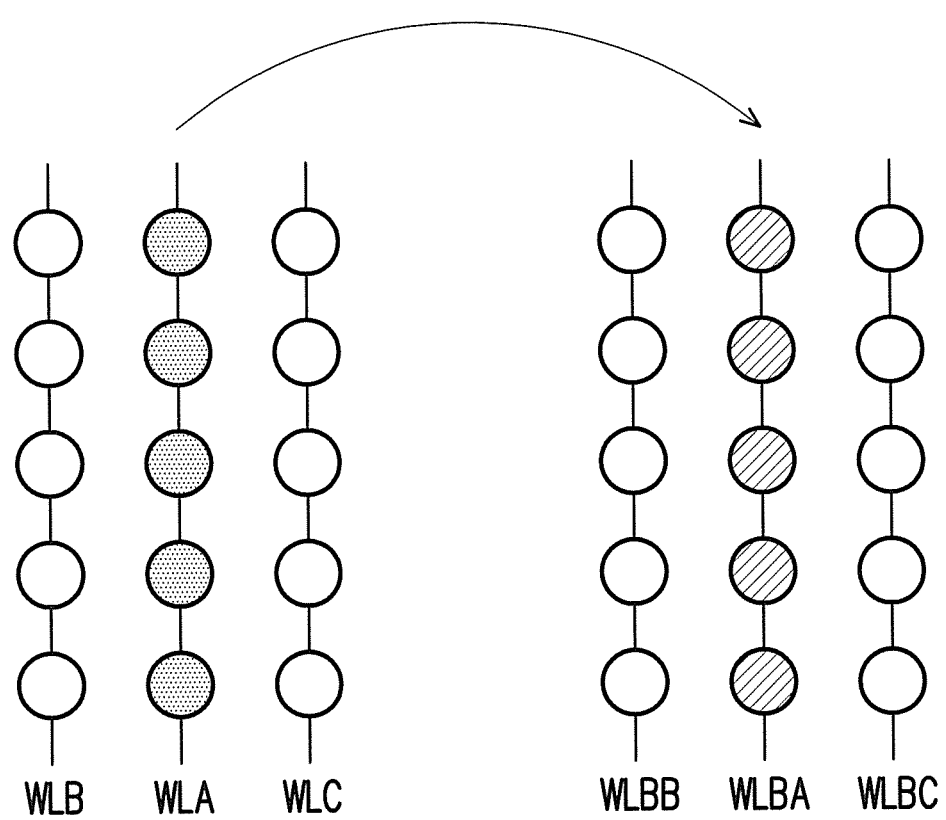
FIG. 3 is a schematic diagram of a replacing operation between a backup word line address and an aggressor word line address.

FIG. 3 is a schematic diagram of a replacing operation between the backup word line address and the aggressor word line address. In FIG. 3, the word lines WLA, WLB and WLC are all general word lines, and word lines WLBA, WLBB and WLBC are set to backup word lines. When a repeat turn-on times of the word line address of the word line WLA is greater than the threshold accessed times, the word line address of the word line WLA is set as the aggressor word line address, and the word line addresses of the word lines WLB and WLC are victim word line addresses. In order to prevent data in the memory cells of the word lines WLB and WLC from being influenced by the repeat turn-on operation of the word line WLA, the word line address of the backup word line WLBA can be set as the backup word line address, and the word line address of the backup word line WLBA is used to replace the word line address of the word line WLA. It should be noticed that the word lines WLBB and WLBC adjacent to the backup word line WLBA are all idle. Namely, the memory cells of the word line addresses of the word lines WLBB and WLBC are not used to store data.

In the process of using the word line address of the backup word line WLBA replace the word line address of the word line WLA, first, data stored in the memory cells of the word line WLA is transferred to the memory cells of the backup word line WLBA. Then, a logic address LA originally mapped to the word line address of the word line WLA is turned to be mapped to the word line address of the backup word line WLBA. In other words, when an accessing operation is to be performed to the logic address LA, the actual accessed word line address is the word line address of the backup word line WLBA.

It should be noticed that after the aforementioned replacing operation of the word line WLA and the backup word line WLBA is completed, the word line WLA set to the aggressor word line address can be set to the idle state.

Figure 4A:
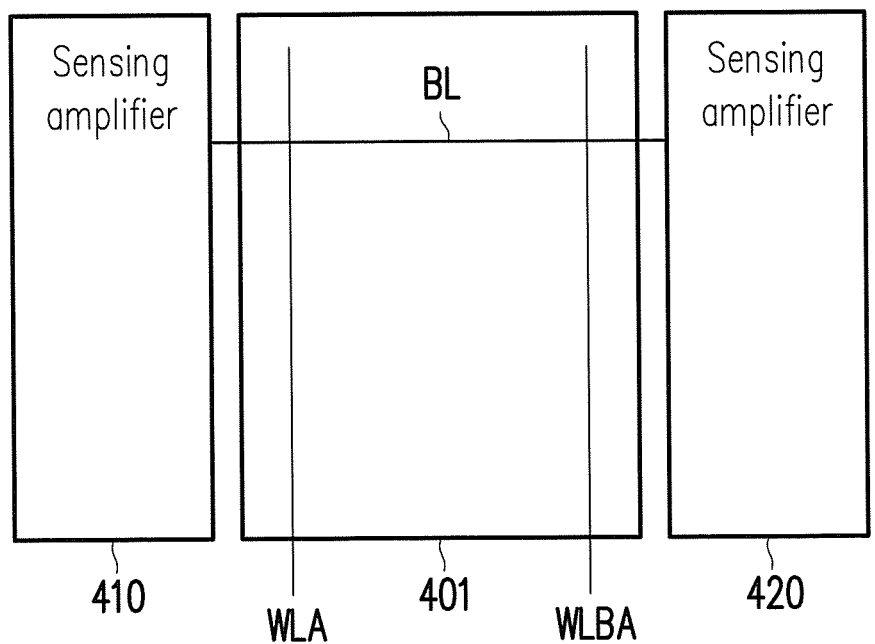
FIG. 4A is a schematic diagram of a data duplication operation according to an embodiment of the invention.
Figure 4B:
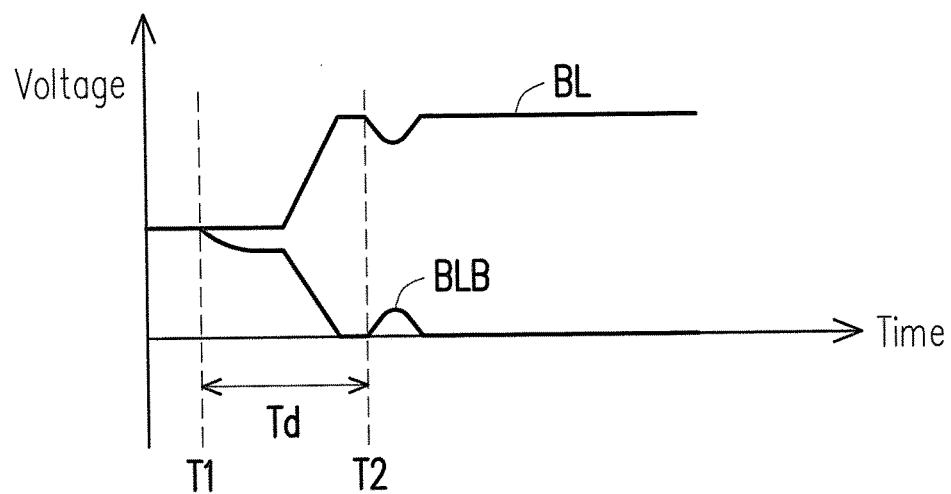
FIG. 4B is a waveform diagram of a data duplication operation according to the embodiment of the invention.

Referring to FIG. 4A and FIG. 4B for description of the operation of duplicating the data of the memory cells of the aggressor word line address to the memory cells of the backup word line address, FIG. 4A is a schematic diagram of a data duplication operation according to an embodiment of the invention, and FIG. 4B is a waveform diagram of the data duplication operation according to the embodiment of the invention. A memory cell array 401 formed by a plurality of memory cells is coupled to sensing amplifiers 410 and 420 through a bit line set composed of bit lines BL and BLB. When the data in the memory cells of the word line address of the word line WLA that is set to the aggressor word line is duplicated to the memory cells of the word line address of the backup word line WLBA, at a time point T1, the word line WLA can be turned on according to a received aggressor word line signal. As a result, voltages of the bit lines BL and BLB start to change after the time point T1. Moreover, at a time point T2 behind the time point T1 by a time delay Td, voltage variation of the bit lines BL and BLB gradually becomes stable, and the backup word line WLBA can be turned on according to a received backup word line signal.

After the backup word line WLBA is turned on, the data in the memory cells of the word line WLA can be transmitted to the sensing amplifier 420 through the bit lines BL and BLB, and the data in the memory cells of the word line WLA is written into the memory cells of the backup word line WLBA through the operation of the sensing amplifier 420.

It should be noticed that at an initial stage that the backup line WLBA is turned on, the voltages on the bit lines BL and BLB are slightly disturbed due to the turn-on operation of the backup word line WLBA. However, a degree of such slight disturbance is not enough to cause an error in the operation of writing data into the memory cells of the backup word line WLBA.

Figure 4C:
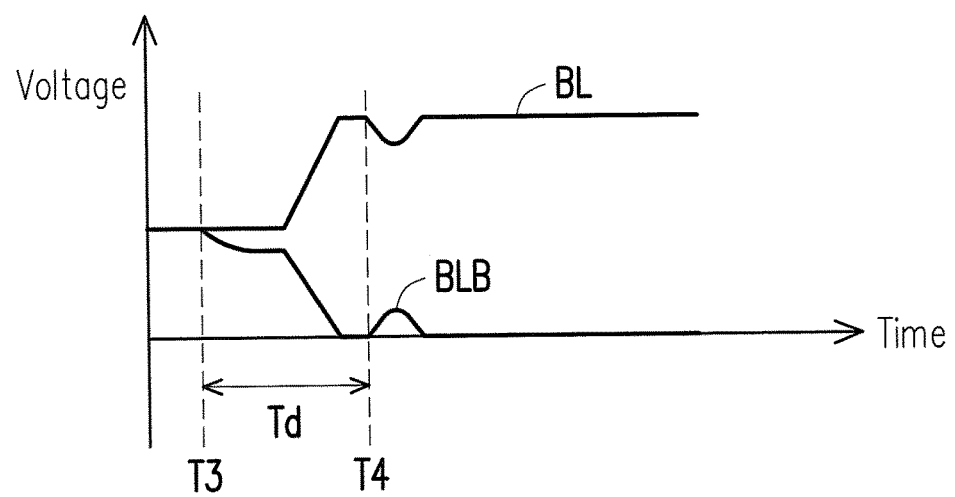
FIG. 4C is a schematic diagram of a restoring operation of an aggressor word line address according to an embodiment of the invention.

A restoring operation of the aggressor word line address is described below. After the refresh operation of the aggressor word line address is performed, the backup word line address can be replaced by the aggressor word line address, so as to restore the aggressor word line address to the normal word line address. Referring to FIG. 4C for the restoring operation of the aggressor word line address, FIG. 4C is a schematic diagram of the restoring operation of the aggressor word line address according to an embodiment of the invention. First, the backup word line WLBA is turned on at a time point T3 in response to a backup word line signal, and the word line WLA is turned on at a time point T4 behind the time point T3 by the time delay Td. In this way, based on the voltages of the bit lines BL and BLB and the operations of the sensing amplifiers 410 and 420, the data in the memory cells of the backup word line WLBA is duplicated to the memory cells of the word line WLA. By re-mapping the word line addresses of the backup word line WLBA and the word line WLA, the restoring operation of the aggressor word line address is completed.

Figure 5A:
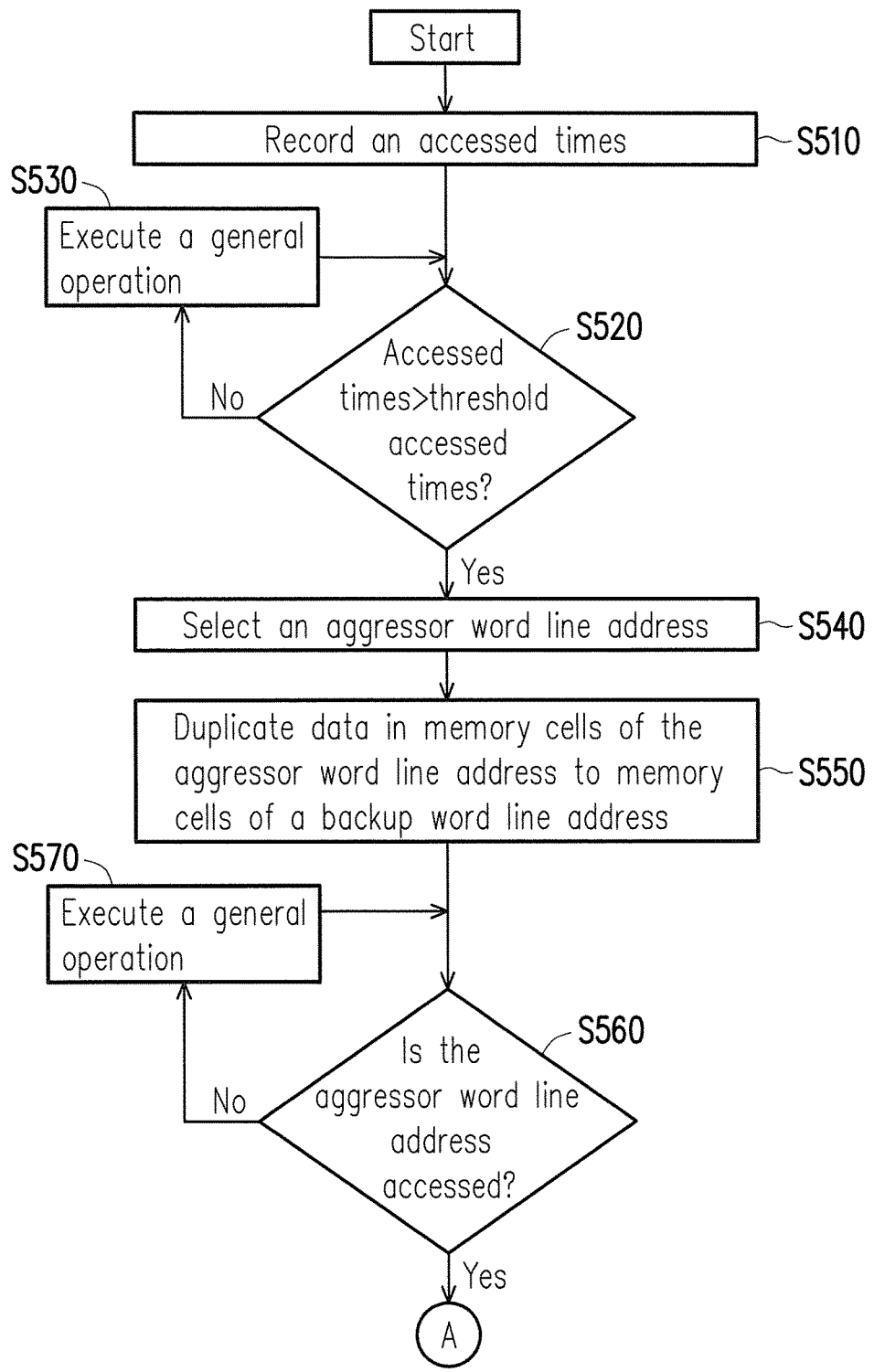
FIG. 5A and FIG. 5B are flowcharts illustrating a method for accessing a memory according to another embodiment of the invention.
Figure 5B:
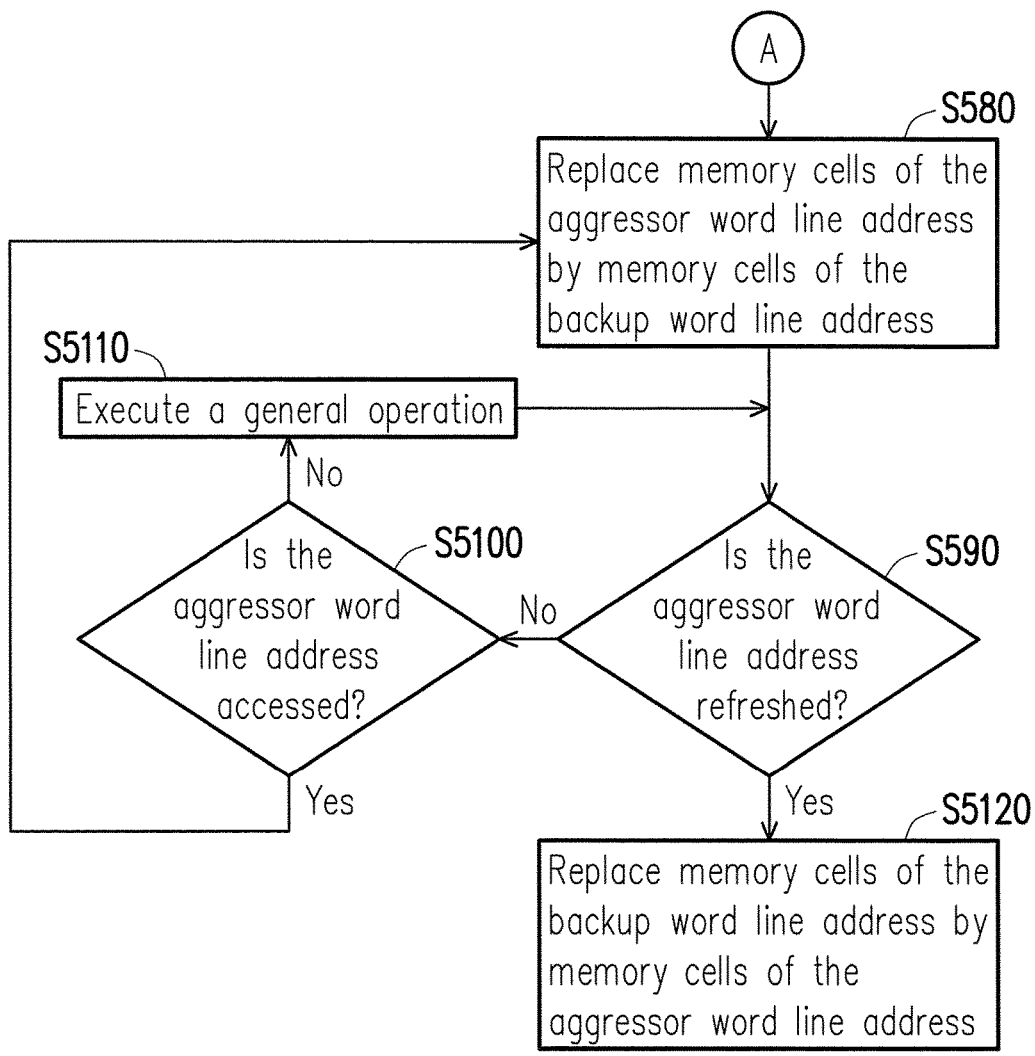

Referring to FIG. 5A and FIG. 5B, FIG. 5A and FIG. 5B are flowcharts illustrating a method for accessing a memory according to another embodiment of the invention. Referring to FIG. 5A, in step S510, an accessed times of each of the word line addresses is calculated, and the obtained accessed times corresponding to each word line address is recorded, where the accessed times of each of the word line addresses can be stored in a storage device (for example, a static memory). In step S520, it is determined whether the accessed times of any word line address is greater than a threshold accessed times. If none of the word line addresses has the situation that the accessed times thereof is greater than the threshold accessed times, a general operation of a step S530 is executed. Comparatively, if the accessed times of a word line address is greater than the threshold accessed times, a step S540 is executed, by which the word line address with the accessed times being greater than the threshold accessed times is set to the aggressor word line address.

Then, in step S550, data in the memory cells of the aggressor word line address is duplicated to the memory cells of the backup word line address. Moreover, in step S560, it is determined whether the aggressor word line address has a new accessing requirement, and if a determination result of the step S560 is negative, a general operation of a step S570 is executed. Comparatively, if the determination result of the step S560 is affirmative, referring to FIG. 5B for further description.

In FIG. 5B, following a node A of FIG. 5A, when the determination result of the step S560 is affirmative, a step S580 is executed to replace the memory cells of the aggressor word line address by using the memory cells of the backup word line address, and the memory cells of the backup word line address are used to implement the new accessing operation mentioned in the step S560. Moreover, in step S590, it is continually determined whether the refresh operation is performed to the aggressor word line address, and if the refresh operation is not performed to the aggressor word line address, once it is determined that a data accessing operation is performed to the aggressor word line address (step S5100), the step S580 is executed to replace the memory cells of the aggressor word line address by using the memory cells of the backup word line address, so as to implement the data accessing operation. Comparatively, in the step S5110, if it is determined that none data accessing operation is performed to the aggressor word line address, a general operation of a step S5110 is executed.

On the other hand, in the step S590, if it is determined that the refresh operation is performed to the aggressor word line address, a step S5120 is executed, by which the backup word line address is replaced by the aggressor word line address to restore the aggressor word line address to a general word line address.

Figure 6:
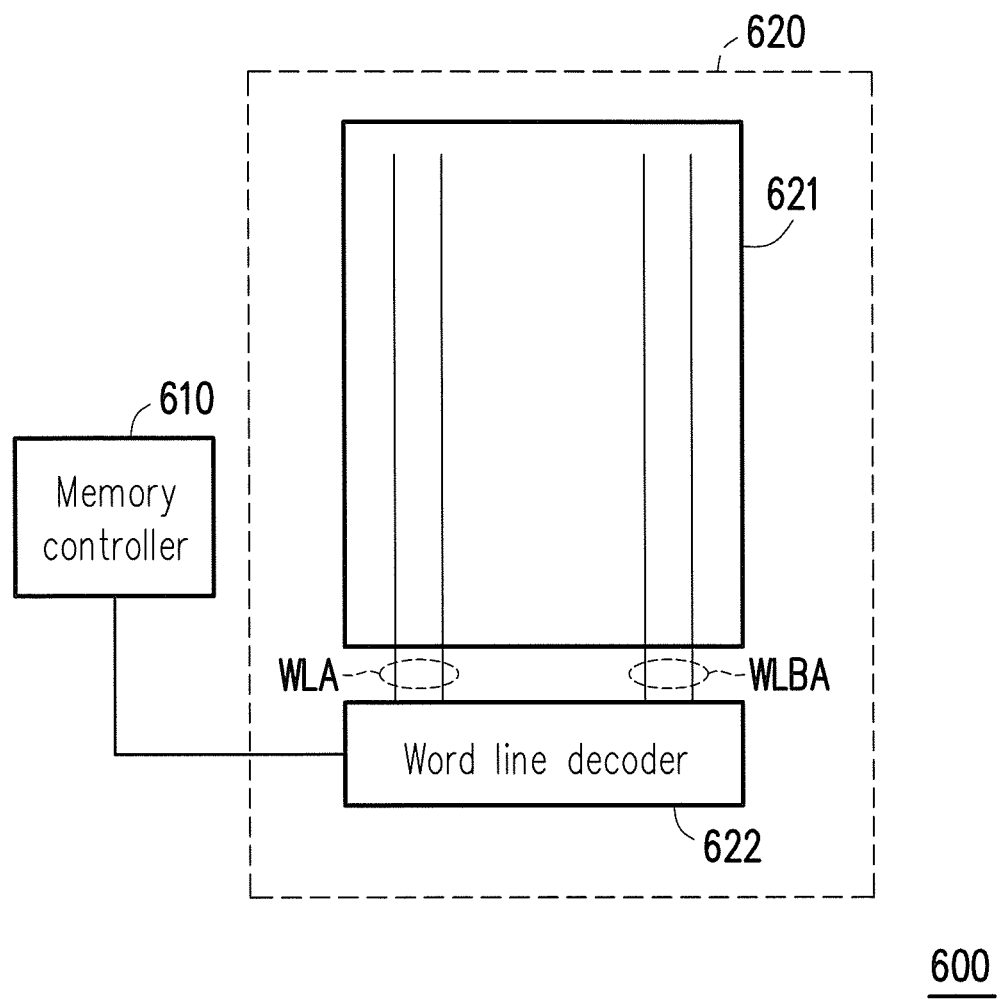
FIG. 6 is a schematic diagram of a memory apparatus according to an embodiment of the invention.

Referring to FIG. 6, FIG. 6 is a schematic diagram of a memory apparatus according to an embodiment of the invention. The memory apparatus 600 includes a memory controller 610, a word line decoder 622 and a dynamic random access memory 620. The dynamic random access memory 620 includes a memory cell array 621 composed of a plurality of memory cells, a plurality of word lines WLA and a plurality of backup word lines WLBA. The memory controller 610 is coupled to the word lines WLA and the backup word lines WLBA. The memory controller 610 calculates an accessed times of a word line address of each of the word lines WLA, and sets the word line address of each of the corresponding word lines as an aggressor word line address by comparing the accessed times and a threshold accessed times. Moreover, the memory controller 610 sets a backup word line address and replaces memory cells of the aggressor word line address by using memory cells of the backup word line address.

The memory controller 610 can generate a word line signal through the word line decoder 622 to turn on or turn off the word lines WLA and the backup word lines WLBA.

Operation details of the memory controller 110 have been introduced in the aforementioned embodiment, which are not repeated.

In summary, whether the word line address is the aggressor word line address is determined by detecting the accessed times of the word line address of the word line, and the backup word line address is used to replace the aggressor word line address to execute the data accessing operation. Therefore, the accessed times of any word line address can be effectively controlled, so as to avoid the row hammer effect. In this way, data stored in the memory can be correctly preserved to improve data reliability.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for accessing a memory, wherein the memory has a plurality of word line addresses, and the method for accessing the memory comprising:

calculating an accessed times of each of the word line addresses;

setting each of the corresponding word line addresses as an aggressor word line address by comparing the accessed times and a threshold accessed times;

setting a backup word line address, and replacing memory cells of the aggressor word line address by memory cells of the backup word line address, wherein, a plurality of the memory cells directly adjacent to the memory cells of the backup word line address are idle; and replacing the memory cells of the backup word line address by the memory cells of the aggressor word line address after a refresh operation of the aggressor word line address is executed, comprising:

duplicating data in the memory cells of the backup word line address to the memory cells of the aggressor word line address;

mapping the aggressor word line address to a logic address mapped to the backup word line address; and setting the backup word line address to an idle state.

2. The method for accessing a memory as claimed in claim 1, wherein the step of calculating the accessed times of each of the word line addresses comprises:

progressively increasing the accessed times of each of the word line addresses when each of the word lines is accessed.

3. The method for accessing a memory as claimed in claim 1, wherein the step of setting each of the corresponding word line addresses as the aggressor word line address by comparing the accessed times and the threshold accessed times comprises:

comparing the accessed times and the threshold accessed times; and setting each of the corresponding word line addresses as the aggressor word line address when the accessed times is greater than the threshold accessed times.

4. The method for accessing a memory as claimed in claim 1, wherein the step of setting the backup word line address, and replacing memory cells of the aggressor word line address by memory cells of the backup word line address comprises:
  duplicating data in the memory cells of the aggressor word line address to the memory cells of the backup word line address;
  mapping the backup word line address to a logic address mapped to the aggressor word line address; and
  setting the aggressor word line address to an idle state.

5. The method for accessing a memory as claimed in claim 4, wherein the step of duplicating data in the memory cells of the aggressor word line address to the memory cells of the backup word line address comprises:
  turning on the memory cells for accessing of the aggressor word line address through a word line signal; and
  turning on the memory cells for accessing of the backup word line address through a backup word line signal after a time delay after turning on the memory cells of the aggressor word line address,
  wherein the data in the memory cells of the aggressor word line address is transmitted to the memory cells of the backup word line address through a plurality of bit line sets in case that the memory cells of the backup word line address are turned on.

6. The method for accessing a memory as claimed in claim 1, wherein the step of duplicating data in the memory cells of the backup word line address to the memory cells of the aggressor word line address comprises:
  turning on the memory cells of the backup word line address for accessing through a backup word line signal; and
  turning on the memory cells of the aggressor word line address for accessing through a word line signal after a time delay after turning on the memory cells of the backup word line address,
  wherein the data in the memory cells of the backup word line address is transmitted to the memory cells of the aggressor word line address through a plurality of bit line sets in case that the memory cells of the aggressor word line address are turned on.

7. A memory apparatus, comprising:
  a dynamic random access memory, comprising a plurality of word lines and a plurality of backup word lines;
  a memory controller, coupled to the word lines and the backup word lines, calculating an accessed times of a word line address of each of the word lines, setting the word line address of each of the corresponding word lines as an aggressor word line address by comparing the accessed times and a threshold accessed times, setting a backup word line address, and replacing memory cells of the aggressor word line address by using memory cells of the backup word line address,
  wherein, a plurality of the memory cells directly adjacent to the memory cells of the backup word line address are idle,
  wherein the memory controller replaces the memory cells of the backup word line address by the memory cells of the aggressor word line address after a refresh operation of the aggressor word line address is executed, when the memory controller replaces the memory cells of the backup word line address by the memory cells of the aggressor word line address, the memory controller duplicates data in the memo cells of the backup word line address to the memory cells of the aggressor word line address, and maps the aggressor word line address to a logic address mapped to the backup word line address, and sets the backup word line address to an idle state.

8. The memory apparatus as claimed in claim 7, wherein when each of the word lines is accessed, the memory controller progressively increases the accessed times of each of the word line addresses.

9. The memory apparatus as claimed in claim 7, wherein the memory controller compares the accessed times and the threshold accessed times, and sets each of the corresponding word line addresses as the aggressor word line address when the accessed times is greater than the threshold accessed times.

10. The memory apparatus as claimed in claim 7, wherein the memory controller replaces the memory cells of the aggressor word line address by using the memory cells of the backup word line address, the memory controller duplicates data in the memory cells of the aggressor word line address to the memory cells of the backup word line address, and maps the backup word line address to a logic address mapped to the aggressor word line address, and sets the aggressor word line address to an idle state.

11. The memory apparatus as claimed in claim 7, wherein when the memory controller duplicates the data in the memory cells of the aggressor word line address to the memory cells of the backup word line address, the memory controller turns on the memory cells of the aggressor word line address through a word line signal, and turns on the memory cells of the backup word line address for accessing through a backup word line signal after a time delay after the memory cells of the aggressor word line address are turned on, wherein the data in the memory cells of the aggressor word line address is transmitted to the memory cells of the backup word line address through a plurality of bit line sets in case that the memory cells of the backup word line address are turned on.

12. The memory apparatus as claimed in claim 7, wherein when the memory controller duplicates the data in the memory cells of the backup word line address to the memory cells of the aggressor word line address, the memory controller turns on the memory cells of the backup word line address for accessing through a backup word line signal, and turns on the memory cells of the aggressor word line address for accessing through a word line signal after a time delay after the memory cells of the backup word line address are turned on, wherein the data in the memory cells of the backup word line address is transmitted to the memory cells of the aggressor word line address through a plurality of bit line sets in case that the memory cells of the aggressor word line address are turned on.

* * * * *